United States Patent
Lee et al.

(10) Patent No.: US 8,755,242 B2
(45) Date of Patent: Jun. 17, 2014

(54) HIGH VOLTAGE GENERATING CIRCUIT AND METHOD OF OPERATING THE SAME

(75) Inventors: Cheon An Lee, Hwaseong-Si (KR); Doogon Kim, Hwaseong-Si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 194 days.

(21) Appl. No.: 13/354,454

(22) Filed: Jan. 20, 2012

(65) Prior Publication Data

US 2012/0236672 A1  Sep. 20, 2012

(30) Foreign Application Priority Data

Mar. 15, 2011 (KR) .................. 10-2011-0023025

(51) Int. Cl.
*G11C 5/14* (2006.01)
(52) U.S. Cl.
USPC ........................................... 365/226
(58) Field of Classification Search
USPC ........................................... 365/226
See application file for complete search history.

(56) References Cited

U.S. PATENT DOCUMENTS

| | | | |
|---|---|---|---|
| 7,126,432 B2 | 10/2006 | Roubadia et al. | |
| 7,821,317 B2 | 10/2010 | Jang | |
| 2001/0038306 A1* | 11/2001 | Kim | 327/536 |
| 2008/0191786 A1* | 8/2008 | Kwon et al. | 327/536 |
| 2009/0067262 A1* | 3/2009 | Kang | 365/189.07 |
| 2009/0290672 A1* | 11/2009 | Ho | 375/374 |
| 2010/0315132 A1* | 12/2010 | Gebara et al. | 327/117 |

FOREIGN PATENT DOCUMENTS

| | | | |
|---|---|---|---|
| KR | 1020000041743 A | 7/2000 | |
| KR | 1020090002643 A | 1/2009 | |
| KR | 1020100079123 A | 7/2010 | |

* cited by examiner

*Primary Examiner* — Hoai V Ho
*Assistant Examiner* — Pablo Huerta
(74) *Attorney, Agent, or Firm* — Volentine & Whitt, PLLC

(57) ABSTRACT

A high voltage generating circuit includes first and second high voltage pump circuits and an oscillator. The oscillator is configured to output a first clock signal driving the first high voltage pump circuit and a second clock signal driving the second high voltage pump circuit. The oscillator includes a first delay circuit configured to output the second clock signal by delaying the first clock signal by a first delay time. The first delay circuit is configured to adjust the first delay time according to a period of the first clock signal.

19 Claims, 11 Drawing Sheets

HIGH VOLTAGE GENERATING CIRCUIT AND METHOD OF OPERATING THE SAME

CROSS-REFERENCE TO RELATED APPLICATIONS

A claim of priority under 35 U.S.C. §119 is made to Korean Patent Application No. 10-2011-0023025 filed Mar. 15, 2011, in the Korean Intellectual Property Office, the entire contents of which are hereby incorporated by reference.

BACKGROUND

Exemplary embodiments of the inventive concept relate to a high voltage generating circuit, and more particularly, to a high voltage generating circuit, an operating method thereof, and a nonvolatile memory device including the same.

Semiconductor memory devices are typically classified as volatile memory devices or nonvolatile memory devices. The volatile memory devices lose stored contents at power-off, while the nonvolatile memory devices retain stored contents even when power is removed or turned off. Nonvolatile memory devices may be formed of various types of memory cell transistors, and may be divided according to structures of the memory cell transistors. Examples of nonvolatile memory devices include flash memory, ferroelectric random access memory (FRAM), magnetic RAM (MRAM), a phase change RAM (PRAM), and the like.

Flash memory devices may be NOR type flash memory devices or NAND flash memory devices, according to the cell array structure. The structure of NOR flash memory devices is that each memory cell transistor is separately connected to a word line and a bit line. Accordingly, NOR flash memory devices generally have excellent random access time characteristics. The structure of NAND flash memory devices is that multiple memory cell transistors are connected in series, which may be referred to as a cell string structure. One cell string may necessitate one bit line contact. Accordingly, NAND flash memory devices generally have excellent integration characteristics.

A NOR flash memory device may store data in a channel hot electron manner, and erase data in a Fowler-Nordheim tunneling manner. A NAND flash memory device may store and erase data in the Fowler-Nordheim tunneling manner. Accordingly, the NOR and NAND flash memory devices may require higher voltage levels than a power supply voltage during erase, program and read operations. The high voltages are generated from charge pumps within the flash memory devices. Such charge pumps may constitute a high voltage generating circuit.

SUMMARY

According to an embodiment of the inventive concept, a high voltage generating circuit includes first and second high voltage pump circuits and an oscillator. The oscillator is configured to output a first clock signal driving the first high voltage pump circuit and a second clock signal driving the second high voltage pump circuit. The oscillator includes a first delay circuit configured to output the second clock signal by delaying the first clock signal by a first delay time. The first delay circuit is configured to adjust the first delay time according to a period of the first clock signal.

The oscillator may be configured to adjust the period of the first clock signal according to control code. Also, the first delay circuit may be further configured to adjust the first delay time according to the control code. The first delay time may increase when the period of the first clock signal becomes longer, and the first delay time may decrease when the period of the first clock signal becomes shorter.

The first delay circuit may have a resistance or a capacitance adjustable according to the control code, and the first delay time may be adjusted according to the resistance or the capacitance.

The high voltage generating circuit may further include a third high voltage pump circuit, and a second delay circuit configured to output a third clock signal by delaying the second clock signal by a second delay time. A sum of the first and second delay times may be less than or equal to the period of the first clock signal. Also, the first delay time may be equal to the second delay time. A voltage generated by the first to third high voltage pump circuits may be provided to a memory cell array of a nonvolatile memory device.

The first delay circuit may include a buffer delaying the first clock signal by the first delay time.

According to another embodiment of the inventive concept, a method of operating a high voltage generating circuit is provided. The method includes generating an output clock signal, generating a first clock signal by delaying the output clock signal by a first delay time, generating a second clock signal by delaying the first clock signal by a second delay time, and generating a voltage in response to the output clock signal, the first clock signal and the second clock signal. A sum of the first and second delay times is less than or equal to a period of the output clock signal.

Generating the output clock signal may include adjusting the period of the output clock signal according to control code. The first and second delay times also may be adjusted according to the control code. The first delay time may be equal to the second delay time.

According to another embodiment of the inventive concept, a high voltage generating circuit for generating an output voltage having a voltage level higher than a power supply voltage includes an oscillator, a high voltage pump and a level detector. The oscillator includes an adjustable oscillator and an adjustable delay block, the adjustable oscillator being configured to output a first pumping clock signal and the adjustable delay block being configured to output a second pumping clock signal by delaying the first pumping clock signal by a first delay time. The high voltage pump includes first and second high voltage pump circuits, the first high voltage pump circuit being configured to perform a first charge pumping operation in response to the first pumping clock signal and the second high voltage pump circuit being configured to perform a second charge pumping operation in response to the first pumping clock signal, the high voltage pump outputting the output voltage based on the first and second charge pumping operations. The level detector is configured to detect the voltage level of the output voltage. The oscillator is controlled to adjust at least a clock period of the first pumping clock signal when the detected voltage level of the output voltage differs from a target voltage.

BRIEF DESCRIPTION OF THE FIGURES

Illustrative embodiments will be more clearly understood from the following detailed description taken in conjunction with the accompanying drawings.

DETAILED DESCRIPTION

Figure 1:
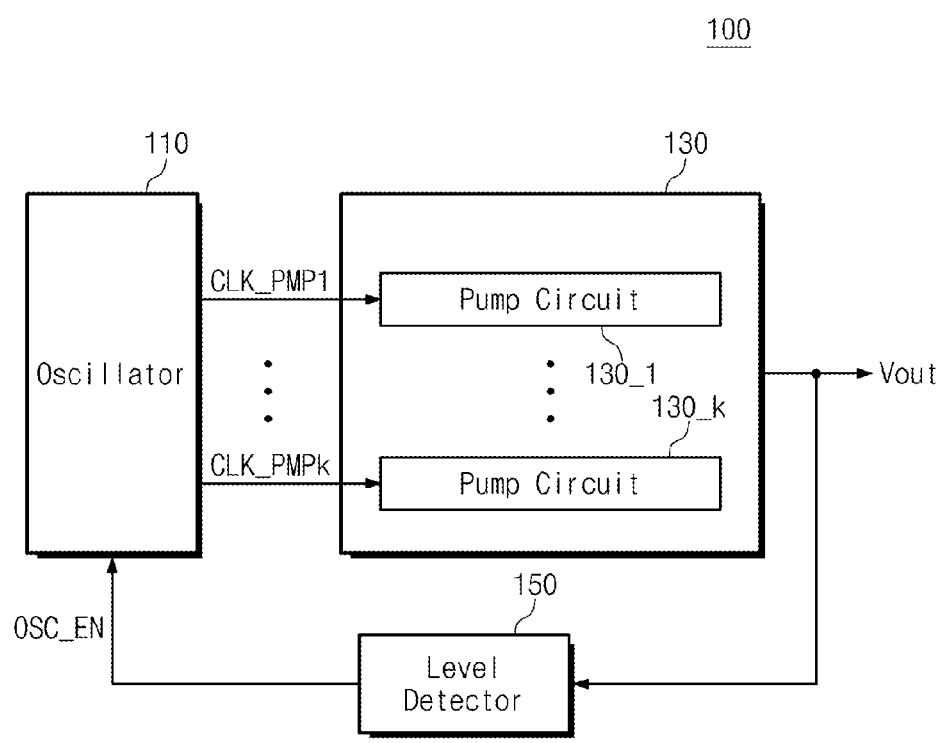
FIG. 1 is a block diagram illustrating a high voltage generating circuit, according to an exemplary embodiment.

Embodiments will be described in detail with reference to the accompanying drawings. The inventive concept, however, may be embodied in various different forms, and should not be construed as being limited only to the illustrated embodiments. Rather, these embodiments are provided as examples so that this disclosure will be thorough and complete, and will fully convey the concept of the inventive concept to those skilled in the art. Accordingly, known processes, elements, and techniques are not described with respect to some of the embodiments of the inventive concept. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 is a block diagram illustrating a high voltage generating circuit, according to an exemplary embodiment. A high voltage generating circuit 100 is configured to generate a high voltage as an output voltage Vout via a high voltage pump block 130, which includes multiple high voltage pump circuits 130_1 to 130_k. The high voltage pump circuits 130_1 to 130_k are respectively controlled by pumping clock signals CLK_PMP1 to CLK_PMPk provided by an oscillator 110. The oscillator 110 generates the pumping clock signals CLK_PMP1 to CLK_PMPk such that operating points of time of the high voltage pump circuits 130_1 to 130_k do not overlap. This means that peak current of the high voltage pump block 130 is reduced.

Referring to FIG. 1, the high voltage generating circuit 100 includes the oscillator 110, the high voltage pump block 130, and a level detector 150. The high voltage pump block 130 is configured to perform a charge pumping operation in response to the pumping clock signals CLK_PMP1 to CLK_PMPk provided by the oscillator 110. As a result of the charge pumping operation, the high voltage pump block 130 generates a voltage (hereinafter, referred to as a high voltage), as output voltage Vout, having a higher voltage level than a power supply voltage.

The level detector 150 is configured to detect the voltage level of the output voltage Vout. The level detector 150 provides an oscillator enable signal OSC_EN (which may be referred to as an oscillator operating signal) to the oscillator 110. For example, when the output voltage Vout has a lower level than a target voltage, the level detector 150 activates the oscillator enable signal OSC_EN. When the output voltage Vout has a higher level than the target voltage, the level detector 150 inactivates the oscillator enable signal OSC_EN.

The oscillator 110 outputs the pumping clock signals CLK_PMP1 to CLK_PMPk in response to the oscillator enable signal OSC_EN of the level detector 150. For example, the oscillator 110 outputs the pumping clock signals CLK_PMP1 to CLK_PMPk in response to activation of the oscillator enable signal OSC_EN. The high voltage pump circuits 130_1 to 130_k operate in response to the pumping clock signals CLK_PMP1 to CLK_PMPk, respectively. The oscillator 110 does not output the pumping clock signals CLK_PMP1 to CLK_PMPk in response to inactivation of the oscillator enable signal OSC_EN. When the pumping clock signals CLK_PMP1 to CLK_PMPk are not generated, the high voltage pump circuits 130_1 to 130_k do not operate.

According to an exemplary embodiment, the oscillator 110 provides the pumping clock signals CLK_PMP1 to CLK_PMPk such that operating points of time of the high voltage pump circuits 130_1 to 130_k do not overlap. For example, the oscillator 110 adjusts delay times among the pumping clock signals CLK_PMP1 to CLK_PMPk so that they are sequentially provided to the high voltage pump block 130. The oscillator 110 adjusts delay times among the pumping clock signals CLK_PMP1 to CLK_PMPk according to the following Equation (1):

$$T \geq \Delta DL \times N \qquad (1)$$

In the Equation (1), T indicates a clock period of an oscillator 110, indicates a delay time between pumping clock signals, and N indicates the number of high voltage pump circuits.

Referring to the Equation (1), the oscillator 110 provides the pumping clock signals CLK_PMP1 to CLK_PMPk, such that operating points of time of the high voltage pump circuits 130_1 to 130_k do not overlap, even under the following condition.

Although the clock period T of the oscillator 110 is varied to increase or decrease the target voltage of the output voltage Vout, the oscillator 110 sequentially provides the pumping clock signals CLK_PMP1 to CLK_PMPk by changing/adjusting the delay time among the pumping clock signals CLK_PMP1 to CLK_PMPk. Further, although the number of high voltage pump circuits in use is varied to increase or decrease the target voltage of the output voltage Vout, the oscillator 110 sequentially provides pumping clock signals corresponding to high voltage pump circuits by changing/adjusting the delay time among the pumping clock signals.

According to an exemplary embodiment, it is possible to reduce a peak current generated when operating points of time of the high voltage pump circuits 130_1 to 130_k overlap. The oscillator 110 and the high voltage pump circuits 130_1 to 130_k in the high voltage generating circuit will be more fully described below with reference to the accompanying drawings.

Figure 2:
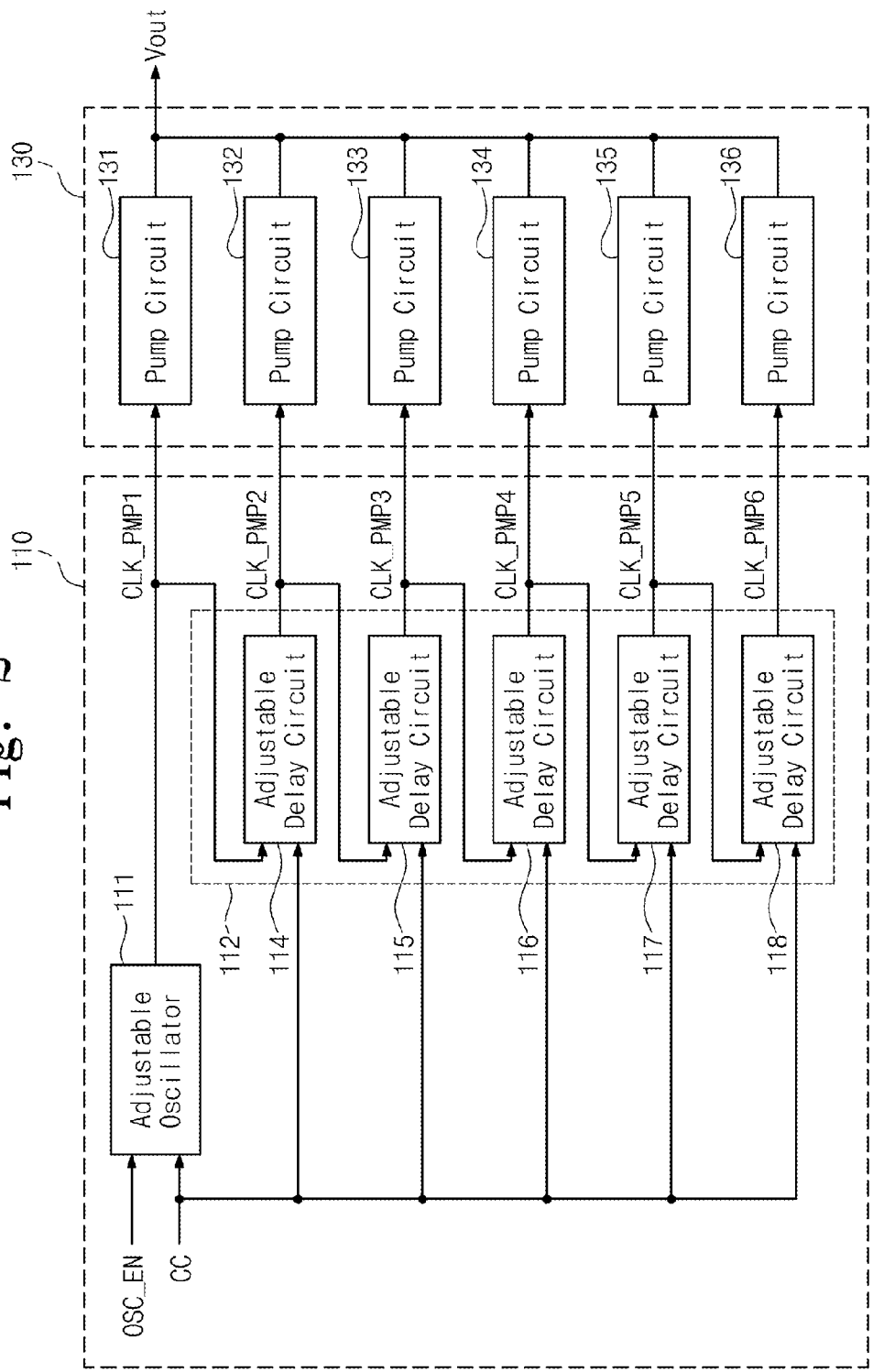
FIG. 2 is a block diagram illustrating an oscillator and a high voltage pump block in a high voltage generating circuit, according to an exemplary embodiment.
Figure 3:
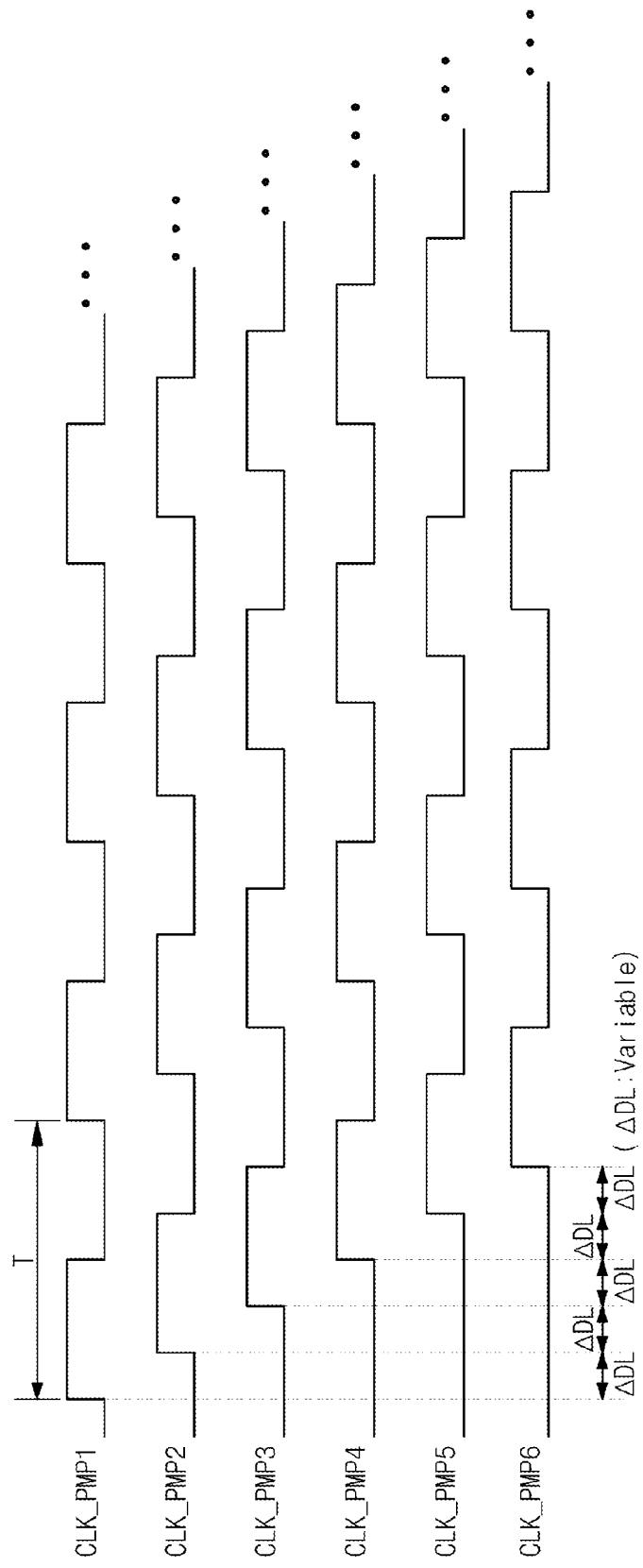
FIG. 3 is a diagram illustrating pumping clock signals generated from an oscillator in FIG. 2, according to an exemplary embodiment.

FIG. 2 is a block diagram illustrating an oscillator and a high voltage pump block in a high voltage generating circuit, according to an exemplary embodiment. FIG. 3 is a diagram illustrating pumping clock signals (CLK_PMP1 to CLK_PMP6) generated by the oscillator in FIG. 2, according to an exemplary embodiment. For convenience of explanation, the depicted example illustrates a high voltage pump block 130 that includes six high voltage pump circuits 131 to 136. However, it is understood that the number of high voltage pump circuits may vary according to a target voltage of the output voltage Vout.

Referring to FIG. 2, an oscillator 110 includes an adjustable oscillator 111 and an adjustable delay block 112. The adjustable delay block 112 includes multiple adjustable delay circuits 114 to 118, which correspond to high voltage pump circuits 132 to 136 in a high voltage pump block 130, respectively. The adjustable delay block 112 provides delayed pumping clock signals CLK_PMP2 to CLK_PMP6 to the high voltage pump block 130.

The adjustable oscillator 111 is configured to adjust a period of an output clock signal according to control code CC, shown as period T of pumping clock signal CLK_PMP1 in FIG. 3. Each of the adjustable delay circuits 114 to 118 in the variable delay block 112 is configured to adjust a delay time of its output clock signal, indicated by pumping clock signals CLK_PMP2 to CLK_PMP6, according to the control code CC. Accordingly, when the period T of the output clock signal of the adjustable oscillator 111 (pumping clock signal CLK_PMP1) is adjusted according to the control code CC, the delay time of each of the pumping clock signals CLK_PMP2 to CLK_PMP6 of the adjustable delay circuits 114 to 118 is also adjusted. For example, when the period T of the pumping clock signal CLK_PMP1 output by the adjustable oscillator 111 becomes longer, the delay time of each of the pumping clock signals CLK_PMP2 to CLK_PMP6 of the adjustable delay circuits 114 to 118 increases. When the period of the pumping clock signal CLK_PMP1 output by the adjustable oscillator 111 becomes shorter, the delay time of each of the pumping clock signals CLK_PMP2 to CLK_PMP6 of the adjustable delay circuit 114 to 118 decreases.

Thus, as described above, when the period T of the pumping clock signal CLK_PMP1 output by the adjustable oscillator 111 changes, the delay times among pumping clock signals CLK_PMP2 to CLK_PMP6 change via the adjustable delay block 112. For example, the period of the pumping clock signal CLK_PMP1 of the adjustable oscillator 111 and a delay time among pumping clock signals CLK_PMP2 to CLK_PMP6 may be adjusted to satisfy the condition of Equation (1). Since the pumping clock signals CLK_PMP1 to CLK_PMP6 are provided such that operating points of time of the high voltage pump circuits 131 to 136 do not overlap, peak current of the high voltage generating circuit 100 in FIG. 1 is reduced.

The oscillator 110 and the high voltage pump block 130 are more fully described below with reference to FIGS. 2 and 3.

Referring to FIGS. 2 and 3, when oscillator enable signal OSC_EN is activated, the adjustable oscillator 111 outputs the first pumping clock signal CLK_PMP1 according to control code CC. The first pumping clock signal CLK_PMP1 is an output clock signal of the adjustable oscillator 111 having period T. The first pumping clock signal CLK_PMP1 is provided to a first high voltage pump circuit 131 without delay. The first high voltage pump circuit 131 performs a charge pumping operation in response to the first pumping clock signal CLK_PMP1.

The first adjustable delay circuit 114 outputs the second pumping clock signal CLK_PMP2 according to the first pumping clock signal CLK_PMP1 and the control code CC. The second pumping clock signal CLK_PMP2 is delayed relative to the first pumping clock signal CLK_PMP1. The delay time of the second pumping clock signal CLK_PMP2 is adjusted according to the control code CC. The second pumping clock signal CLK_PMP2 is provided to a second high voltage pump circuit 132. The second high voltage pump circuit 132 performs a charge pumping operation in response to the second pumping clock signal CLK_PMP2.

The second adjustable delay circuit 115 outputs the third pumping clock signal CLK_PMP3 according to the second pumping clock signal CLK_PMP2 and the control code CC. The third pumping clock signal CLK_PMP3 is delayed relative to the second pumping clock signal CLK_PMP2. In an embodiment, the delay time of the second adjustable delay circuit 115 is the same as that of the first adjustable delay circuit 114. The third pumping clock signal CLK_PMP3 is provided to a third high voltage pump circuit 133. The third high voltage pump circuit 133 performs a charge pumping operation in response to the third pumping clock signal CLK_PMP3.

Fourth to sixth pumping clock signals CLK_PMP4 to CLK_PMP6 are generated in substantially the same manner as described above, where the fourth pumping clock signal CLK_PMP4 is delayed relative to the third pumping clock signal CLK_PMP3, the fifth pumping clock signal CLK_PMP5 is delayed relative to the fourth pumping clock signal CLK_PMP4, and the sixth pumping clock signal CLK_PMP6 is delayed relative to the fifth pumping clock signal CLK_PMP5. Fourth to sixth high voltage pump circuits 134 to 136 perform charge pumping operations in response to the fourth to sixth pumping clock signals CLK_PMP4 to CLK_PMP6, respectively. The outputs of the first to sixth high voltage pump circuits 131-136 are combined to provide the output voltage Vout.

As understood from FIG. 3, a sum total delay time (ΔDL× 5) of the adjustable delay circuits 114 to 118 is less than (or equal to) the period T of the output clock signal of the adjustable oscillator 111, that is, the first pumping clock signal CLK_PMP1. The oscillator 110 is configured to satisfy the above-described condition, referred to in Equation (1), and provides the high voltage pump block 130 with the pumping clock signals CLK_PMP1 to CLK_PMP6, such that operating points of time of the high voltage pump circuits 131 to 136 do not overlap.

Figure 4:
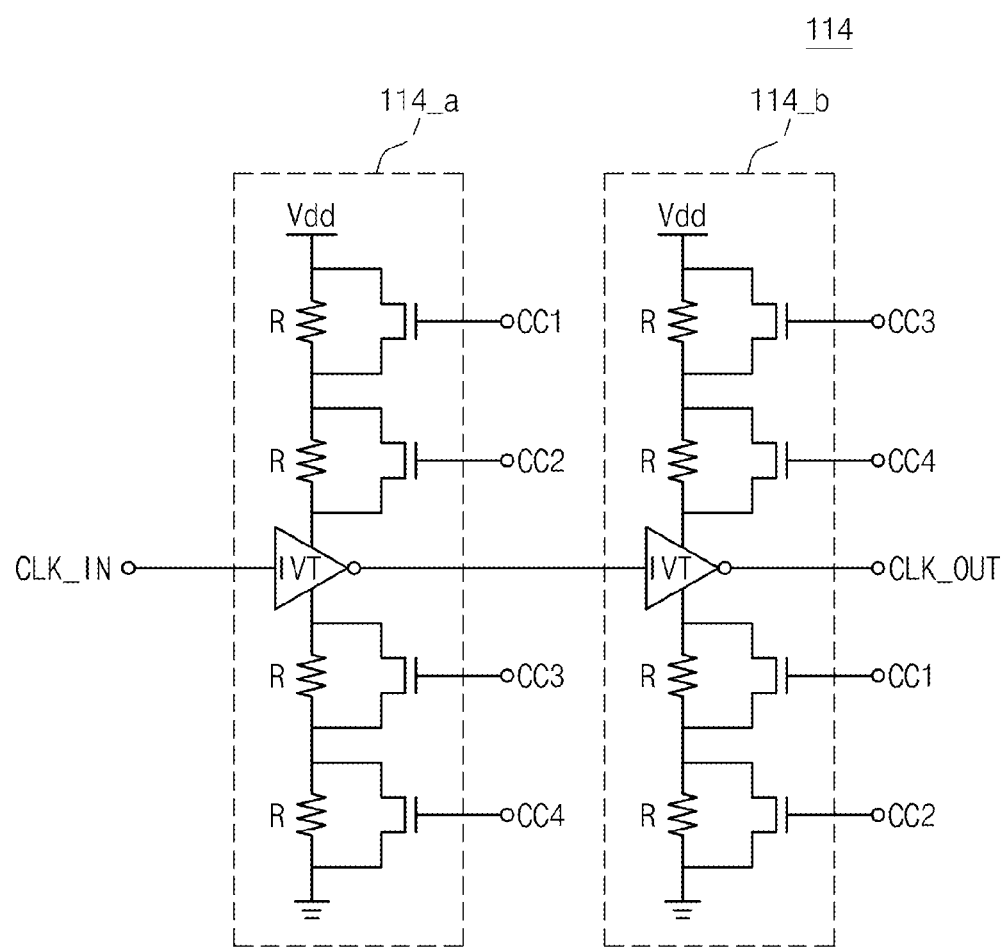
FIG. 4 is a circuit diagram illustrating an adjustable delay circuit, according to an exemplary embodiment.

FIG. 4 is a circuit diagram illustrating an adjustable delay circuit, according to an exemplary embodiment. In FIG. 4, adjustable delay circuit 114 of the multiple adjustable delay circuits 114 to 118 is illustrated. The adjustable delay circuit 114 delays an input clock signal CLK_IN (e.g., first pumping clock signal CLK_PMP1 output by adjustable oscillator 111) by a delay time according to control code CC. The other adjustable delay circuits 115 to 118 are likewise configured to delay respective input clock signals by the delay time according to the control code CC, as discussed above.

The adjustable delay circuit 114 includes two inverters 114_a and 114_b, for example. The inverters 114_a and 114_b have the same configuration. The inverters 114_a and 114_b adjust the delay time of an output clock signal CLK_OUT (e.g., second pumping clock signal CLK_PMP2). This may be accomplished by controlling resistance values according the control codes CC1 to CC4, respectively. For example, when a resistance value of the inverters 114_a and 114_b increases according to one of the control codes CC1 to CC4, the delay time increases. When a resistance value of the inverters 114_a and 114_b decreases according to one of the control codes CC1 to CC4, the delay time decreases.

Figure 5:
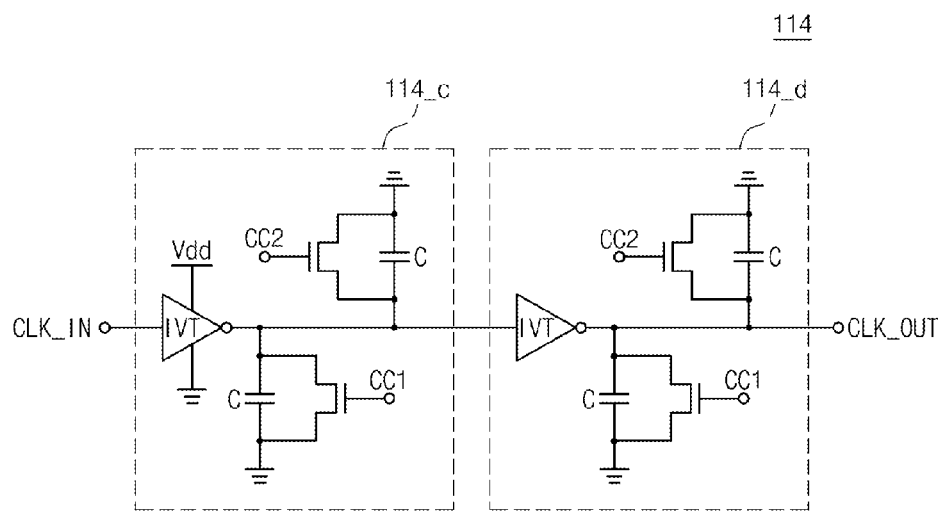
FIG. 5 is a circuit diagram illustrating an adjustable delay circuit according to another exemplary embodiment.

FIG. 5 is a circuit diagram illustrating an adjustable delay circuit, according to another exemplary embodiment. In FIG. 5, adjustable delay circuit 114 of the multiple adjustable delay circuits 114 to 118 is illustrated. The adjustable delay circuit 114 delays an input clock signal CLK_IN (e.g., first pumping clock signal CLK_PMP1 output by adjustable oscillator 111) by a delay time according to control code CC. The other adjustable delay circuits 115 to 118 are likewise configured to delay respective input clock signals by the delay time according to the control code CC, as discussed above.

The adjustable delay circuit 114 of FIG. 5 is formed of two inverters 114_c and 114_d, for example. The inverters 114_c and 114_d have the same configuration. The inverters 114_c and 114_d adjust the delay time of an output clock signal CLK_OUT. This may be accomplished by controlling a capacitance value according the control codes CC1 to CC4. For example, when a capacitance value of the inverters 114_c and 114_d increases according to the control codes CC1 and CC2, the delay time increases. When a capacitance value of the inverters 114_c and 114_d decreases according to the control codes CC1 and CC2, the delay time decreases.

Figure 6:
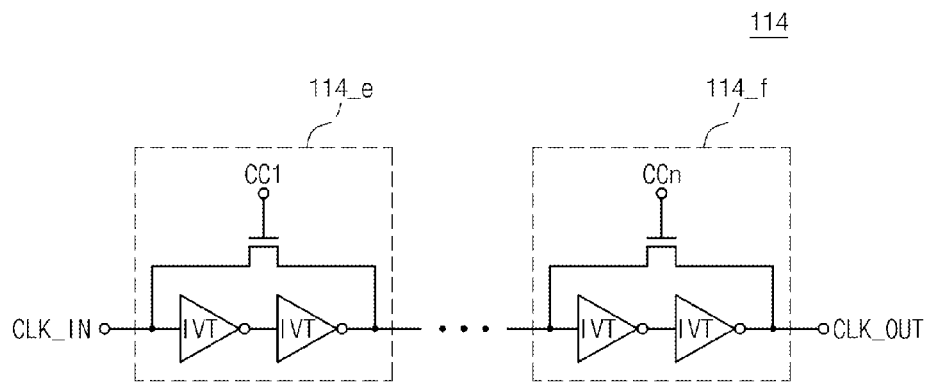
FIG. 6 is a circuit diagram illustrating an adjustable delay circuit, according to still another exemplary embodiment.

FIG. 6 is a circuit diagram illustrating an adjustable delay circuit, according to still another exemplary embodiment. In FIG. 6, adjustable delay circuit 114 of the multiple adjustable delay circuits 114 to 118 is illustrated. The adjustable delay circuit 114 delays an input clock signal CLK_IN (e.g., first pumping clock signal CLK_PMP1 output by adjustable oscillator 111) by a delay time according to control code CC. The remaining adjustable delay circuits 115 to 118 are likewise configured to delay respective input clock signals by the delay time according to the control code CC, as discussed above.

The adjustable delay circuit 114 includes multiple buffers 114_e to 114_f, each of which is formed of two inverters. The buffers 114_e to 114_f are configured the same each other. The buffers 114_e to 114_f are controlled by control codes CC1 to CCn to adjust the delay time of an output clock signal CLK_OUT. The buffers 114_e to 114_f are separately controlled by the control codes CC1 to CCn to delay or bypass the input clock signal CLK_IN. This means that the number of buffers in the adjustable delay circuit 114 is adjusted by the control codes CC1 to CCn. Accordingly, it is possible to adjust the delay time.

Figure 7:
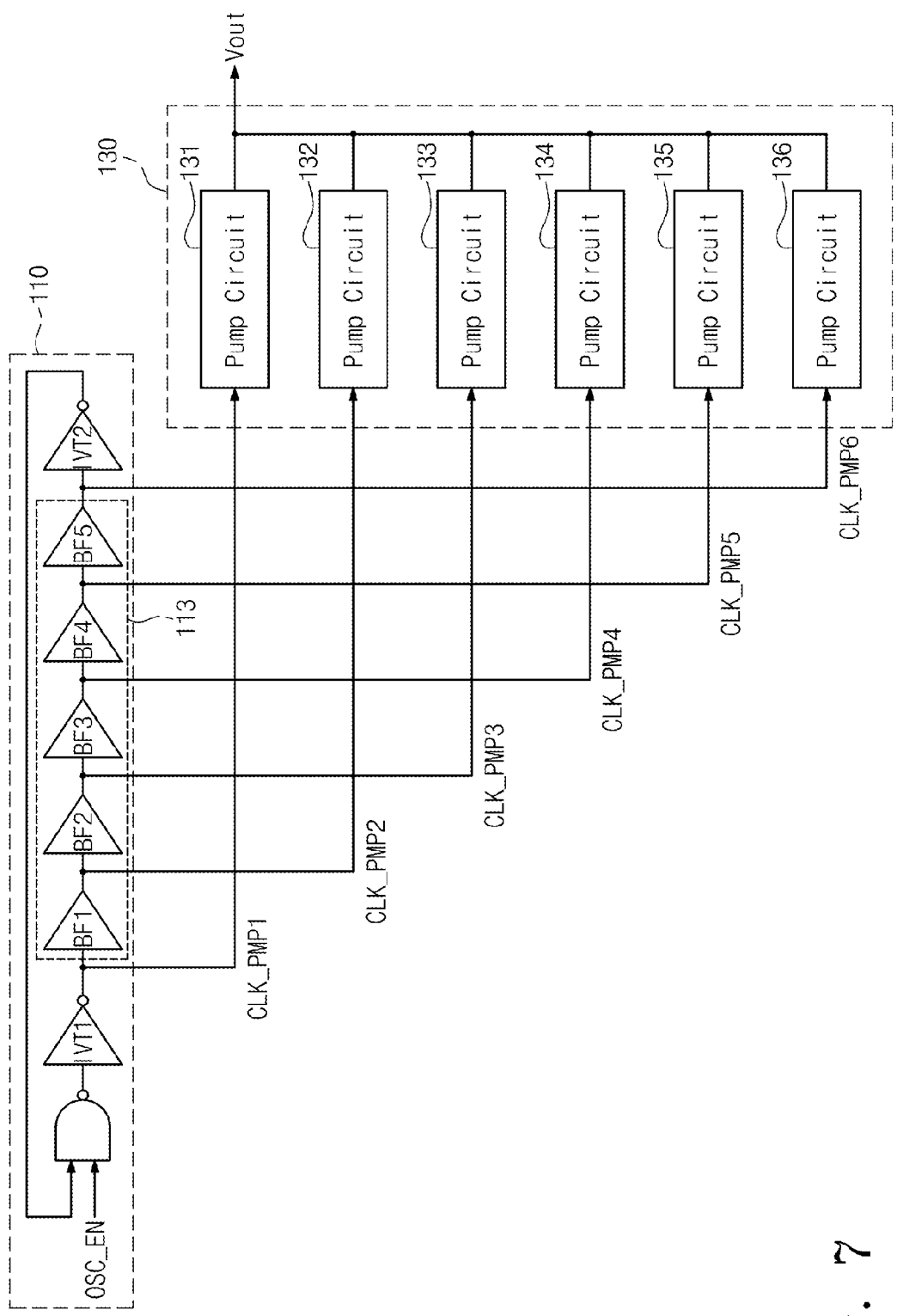
FIG. 7 is a block diagram illustrating an oscillator and a high voltage pump block in a high voltage generating circuit, according to another exemplary embodiment.
Figure 8:
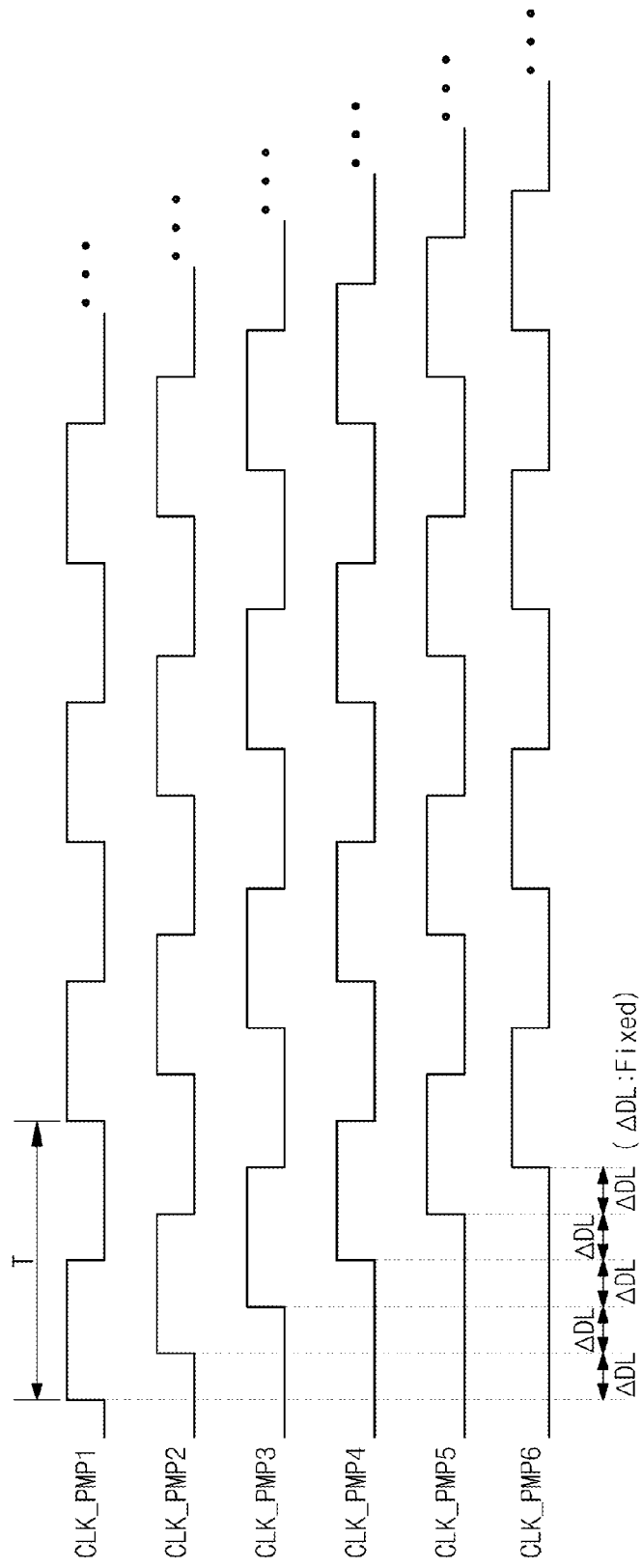
FIG. 8 is a diagram illustrating pumping clock signals generated from an oscillator in FIG. 7, according to another exemplary embodiment.

FIG. 7 is a block diagram illustrating an oscillator and a high voltage pump block in a high voltage generating circuit, according to another exemplary embodiment. FIG. 8 is a diagram illustrating pumping clock signals generated from the oscillator in FIG. 7, according to an exemplary embodiment.

Referring to FIG. 7, an oscillator 110 is formed as a ring oscillator. The oscillator 110 includes a delay circuit 113, which has multiple buffer circuits BF1 to BF5, each of which includes two inverters. The buffer circuits BF1 to BF5 may delay input clock signals by the same delay time, respectively.

For convenience of explanation, in the example shown in FIG. 7, the high voltage pump block 130 is formed of six high voltage pump circuits 131 to 136, and the delay circuit 113 of the oscillator 110 includes five buffer circuits BF1 to BF5. However, it is understood that the number of high voltage pump circuits and the number of buffer circuits included in the oscillator 110 may vary according to the target voltage of an output voltage Vout.

The oscillator 110 provides the high voltage pump block 130 with pumping clock signals CLK_PMP1 to CLK_PMP6. The pumping clock signals CLK_PMP1 to CLK_PMP6 may be output at different points of time via the delay circuit 113. In other words, the oscillator 110 outputs the pumping clock signals CLK_PMP1 to CLK_PMP6 such that operating points of time of the high voltage pump circuits 131 to 136 do not overlap.

The oscillator 110 and the high voltage pump block 130 are more fully described below with reference to FIGS. 7 and 8.

Referring to FIGS. 7 and 8, when oscillator enable signal OSC_EN is activated, the oscillator 110 oscillates a clock signal. The oscillated clock signal is provided to a first high voltage pump circuit 131 as a first pumping clock signal CLK_PMP1 having period T. The first high voltage pump circuit 131 performs a charge pumping operation in response to the first pumping clock signal CLK_PMP1.

The first buffer circuit BF1 delays the first pumping clock signal CLK_PMP1 by delay time ΔDL to output it as a second pumping clock signal CLK_PMP2. The second pumping clock signal CLK_PMP2 is provided to a second high voltage pump circuit 132. The second high voltage pump circuit 132 performs a charge pumping operation in response to the second pumping clock signal CLK_PMP2.

The second buffer circuit BF2 delays the second pumping clock signal CLK_PMP2 by the delay time ΔDL to output it as a third pumping clock signal CLK_PMP3. Herein, the delay time ΔDL of the first buffer circuit BF1 is equal to that of the second buffer circuit BF2. The third pumping clock signal CLK_PMP3 is provided to a third high voltage pump circuit 133. The third high voltage pump circuit 133 performs a charge pumping operation in response to the third pumping clock signal CLK_PMP3.

Fourth to sixth pumping clock signals CLK_PMP4 to CLK_PMP6 may be generated in substantially the same manner described above, where third buffer circuit BF3 delays the third pumping clock signal CLK_PMP3 by the delay time ΔDL to output it as a fourth pumping clock signal CLK_PMP4, fourth buffer circuit BF4 delays the fourth pumping clock signal CLK_PMP4 by the delay time ΔDL to output it as a fifth pumping clock signal CLK_PMP5, and fifth buffer circuit BF5 delays the fifth pumping clock signal CLK_PMP5 by the delay time ΔDL to output it as a sixth pumping clock signal CLK_PMP6. Fourth to sixth high voltage pump circuits 134 to 136 perform charge pumping operations in response to the fourth to sixth pumping clock signals CLK_PMP4 to CLK_PMP6, respectively.

As understood from FIG. 8, a sum total delay time (ΔDL× 5) of the buffer circuits BF1 to BF5 is less than (or equal to) the period T of the first pumping clock signal CLK_PMP1. The oscillator 110 is configured to satisfy the above-described condition, referred to the Equation (1), and provides the high voltage pump block 130 with the pumping clock signals CLK_PMP1 to CLK_PMP6, such that operating points of time of the high voltage pump circuits 130_1 to 130_6 do not overlap.

Since the oscillator 110 provides the high voltage pump block 130 with the pumping clock signals CLK_PMP1 to CLK_PMP6, such that operating points of time of the high voltage pump circuits 130_1 to 130_6 do not overlap, and peak current of the high voltage generating circuit 100 is reduced.

Figure 9:
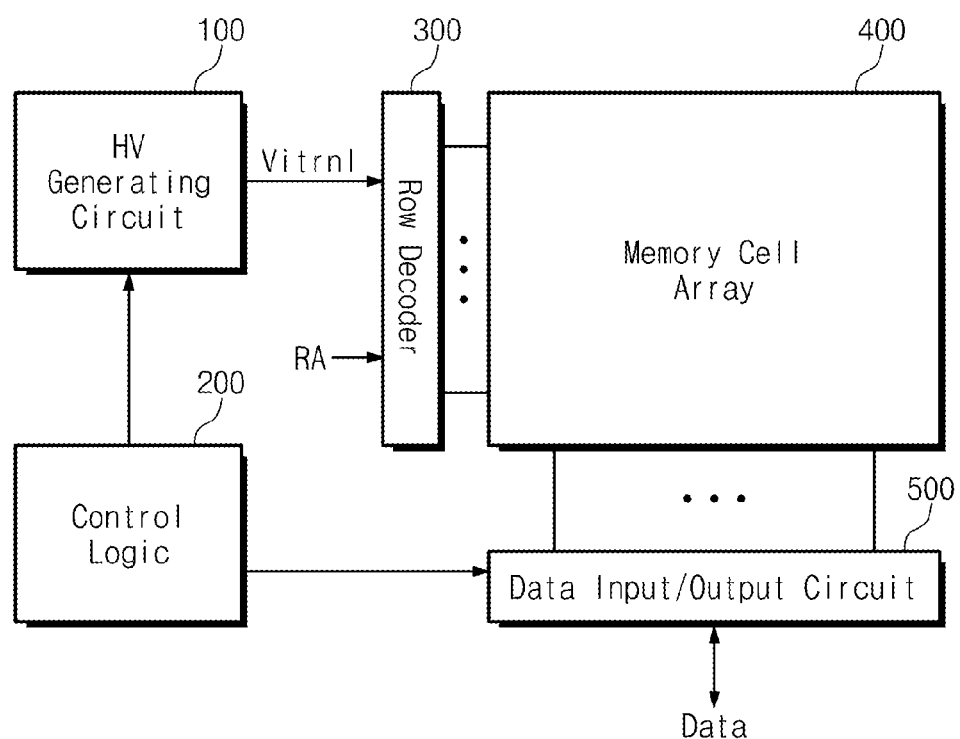
FIG. 9 is a block diagram illustrating a nonvolatile memory device including a high voltage generating circuit, according to exemplary embodiments.

FIG. 9 is a block diagram illustrating a nonvolatile memory device including a high voltage generating circuit, according to exemplary embodiments. A memory device including a high voltage generating circuit may be a flash memory device 1000. However, it is understood that the high voltage generating circuit 100 according to exemplary embodiments may be applied to various types of memory devices using a high voltage higher than a power supply voltage.

Referring to FIG. 9, a flash memory device 1000 includes a high voltage generating circuit 100, control logic 200, a row decoder 300, a memory cell array 400, and a data input/output circuit 500.

The memory cell array 400 includes multiple memory cells arranged at intersections of a plurality of rows (or, word lines) and a plurality of columns (or, bit lines). Each memory cell of the memory cell array 400 may store one or more bits of data.

The row decoder 300 is controlled by the control logic 200, and selectively drives word lines of the memory cell array 400 in response to a row address RA. The row decoder 300 applies one of voltages generated from the high voltage generating circuit to a corresponding word line.

The data input/output circuit 500 includes data input/output circuits (not shown) corresponding to bit lines of the memory cell array 400. The data input/output circuit 500 is controlled by the control logic 200. The data input/output circuit 500 operates as a sense amplifier or a write driver according to a mode of operation. For example, the data input/output circuit 500 operates as a sense amplifier during a read operation and a write driver during a program operation.

The control logic 200 controls overall operation of the flash memory device 1000 in response to a command or a control signal from an external device (e.g., a host, a memory controller, a memory interface, etc.). For example, the control logic 200 controls erase, program, and read operations of the flash memory device 1000. The control logic 200 controls the high voltage generating circuit 100 so as to generate voltages needed for the operations.

The high voltage generating circuit 100 is configured to generate various internal voltages Vitrnl according to a mode of operation. For example, the high voltage generating circuit 100 generates voltages needed for the erase, program, and read operations, respectively.

The high voltage generating circuit 100 may include a high voltage generator for generating an erase voltage needed for the erase operation, a high voltage generator for generating a program voltage needed for the program operation, and a high voltage generator for generating a read voltage needed for the read operation. In various embodiments, the high voltage generating circuit 100 may further include a regulator, which divides a generated voltage so as to generate a required voltage. Generally, the high voltage generating circuit 100 may be the same as described above with regard to FIGS. 1 to 8.

Figure 10:
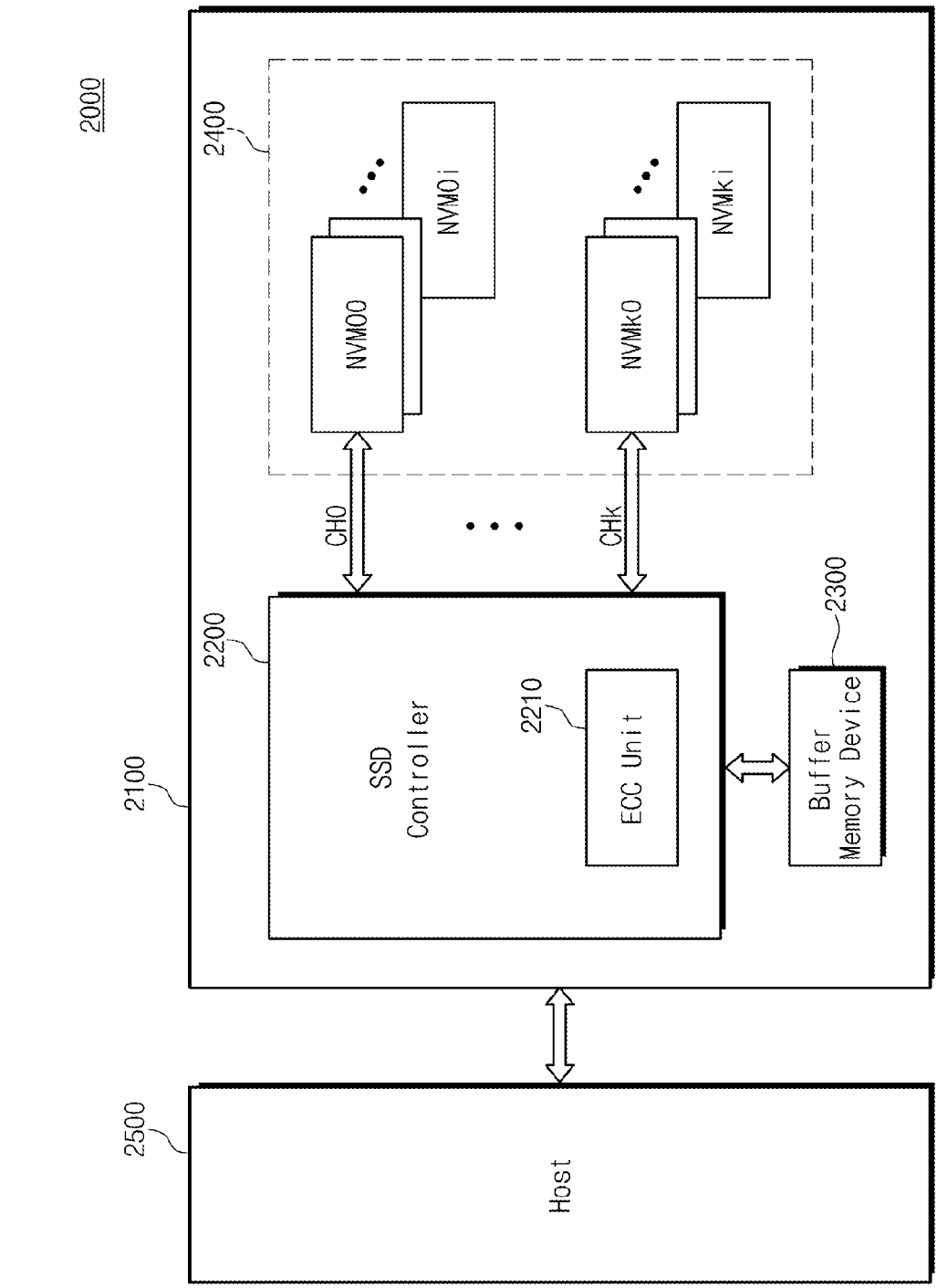
FIG. 10 is a block diagram of a user device including a nonvolatile memory device in FIG. 9, according to an exemplary embodiment.

FIG. 10 is a block diagram of a user device including the nonvolatile memory device of FIG. 9, according to exemplary embodiments.

Referring to FIG. 10, a user device 2000 includes a data storage device 2100 and a host device 2500. The data storage device 2100 may be a solid state drive (SSD), for example. The data storage device 2100 includes a controller 2200 (e.g., an SSD controller), a buffer memory device 2300, and storage medium 2400.

The data storage device 2100 according to an exemplary embodiment may further include an auxiliary power supply having super capacitors. The auxiliary power supply may power the data storage device 2100 in the event of a sudden power-off, such that operation of the data storage device 2100 is ended normally.

The data storage device 2100 operates in response to an access request of the host 2500. That is, the controller 2200 responds to a request from the host 2500 to access the storage medium 2400. For example, the controller 2200 may be configured to control read, write, and erase operations of the storage medium 2400. The buffer memory device 2300 temporarily stores data to be stored in the storage medium 2400. Further, the buffer memory device 2300 temporarily stores data read out from the storage medium 2400. Data stored in the buffer memory device 2300 is transferred to the storage medium 2400 or the host 2500 under control of the controller 2200.

The controller 2200 is connected with the storage medium 2400 via channels CH0 to CHk, each of which is connected with non-volatile memory devices (NVM00 to NVM0i.) to (NVMk0 to NVMki). The non-volatile memory devices may share a channel. The storage medium 2400 may be formed of a NAND flash memory device, according to an exemplary embodiment. However, it is understood that the storage medium 2400 is not limited to the NAND flash memory device. For example, the storage medium 2400 may be formed of one of nonvolatile memory devices, such as a NOR flash memory device, a phase-change RAM (PRAM), a ferroelectric RAM (FRAM), a magnetic RAM (MRAM), and so on.

The controller 2200 includes an ECC unit 2210. The ECC unit 2210 may detect and correct errors of data read out from the storage media 2400.

Figure 11:
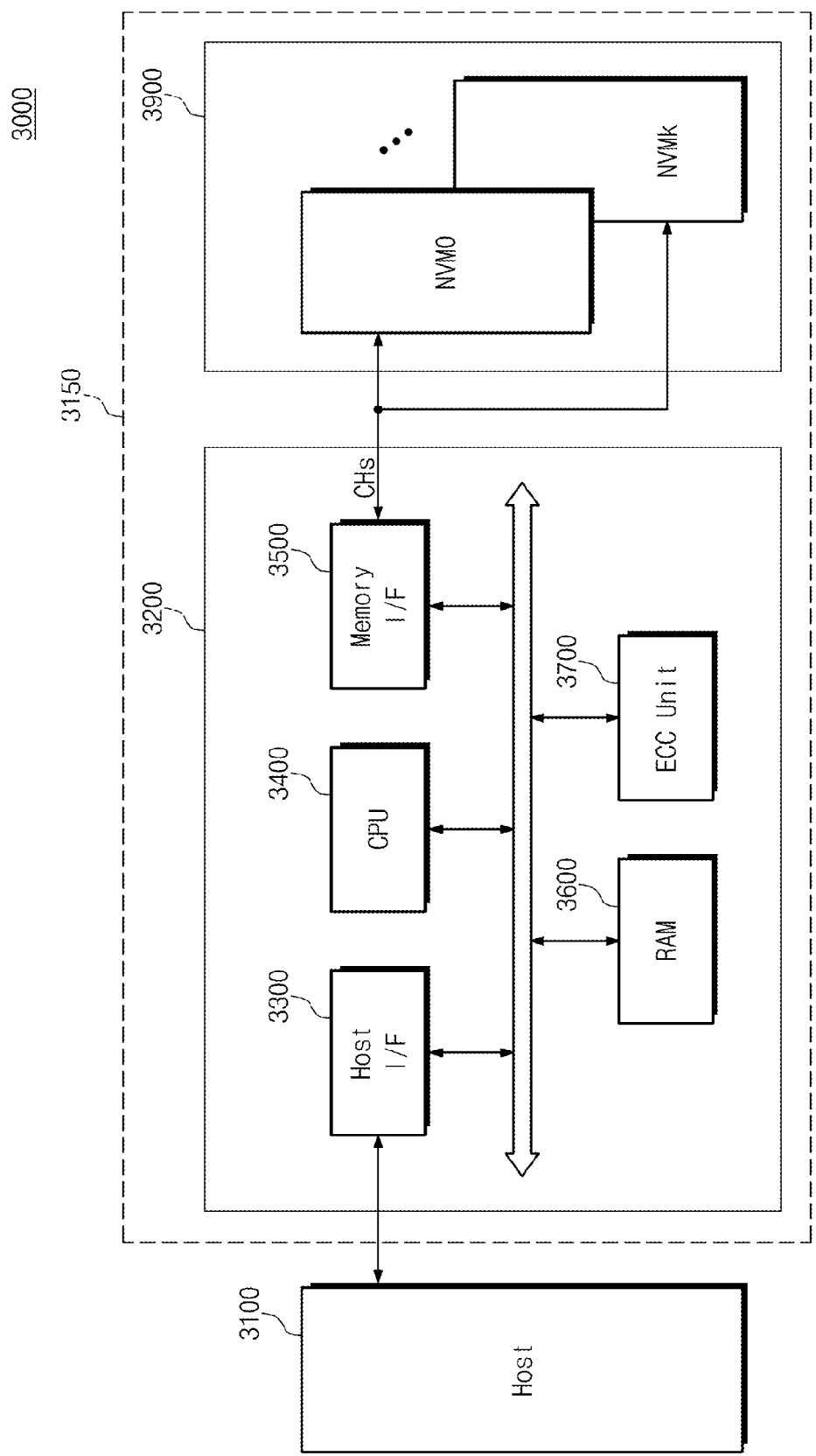
FIG. 11 is a block diagram of another user device including a nonvolatile memory device in FIG. 9, according to an exemplary embodiment.

FIG. 11 is a block diagram of another user device including the nonvolatile memory device of FIG. 9, according to exemplary embodiments.

Referring to FIG. 11, a user device 3000 includes a host device 3100 and a data storage device 3150. The data storage device 3150 includes a controller 3200 and data storage media 3900 formed of multiple data storage medium.

The controller 3200 is connected to the host 3100 and the data storage media 3900. The controller 3200 responds to a request of the host 3100 to access the data storage media 3900. For example, the controller 3200 is configured to control read, write, and erase operations of the data storage media 3900. The controller 3200 is configured to provide an interface between the data storage media 3900 and the host 3100. The controller 3200 is configured to drive firmware for controlling the data storage media 3900.

The controller 3200 includes constituent elements, such as RAM 3600, a CPU 3400, a host interface 3300, an ECC unit 3700, and a memory interface 3500. The RAM 3600 may be used as a working memory of the CPU 3400. The CPU 3400 may control an overall operation of the controller 3200.

The host interface 3300 includes a protocol for executing data exchange between the host 3100 and the controller 3200. For example, the memory controller 3200 is configured to communicate with an external device (for example, a host) through at least one of various interface protocols, such as an Universal Serial Bus (USB) protocol, a MultiMedia Card (MMC) protocol, a Peripheral Component Interconnection (PCI) protocol, a PCI-express (PCI-E) protocol, an Advanced Technology Attachment (ATA) protocol, a Serial-ATA protocol, a Parallel-ATA protocol, a Small Computer Small Interface (SCSI) protocol, an Enhanced Small Disk Interface (ESDI) protocol, an Integrated Drive Electronics (IDE) protocol, and the like.

The ECC unit 3700 is configured to detect error in data read out from the data storage media 3900 and to correct the detected error. The memory interface 3500 provides an interface between the data storage media 3900 and the controller 3200.

It is understood that the controller 3200 is not limited to the description set forth herein. For example, the controller 3200 may further include ROM, which stores code data needed for an initial booting operation and data for interfacing with the host 3100.

The controller 3200 and the data storage media 3900 may be integrated in single semiconductor device to form a memory card such as a personal computer memory card international association (PCMCIA) card, a compact flash (CF) card, a smart media card, a memory stick, a multimedia card (MMC, RS-MMC, MMC-micro), an SD card (SD, Mini-SD, Micro-SD, SDHC), universal flash storage (UFS), and so on.

In various embodiments, the controller 3200 and the data storage media 3900 may be used as a solid state drive (SSD), a computer, a portable computer, an Ultra Mobile PC (UMPC), a workstation, a net-book, a PDA, a web tablet, a wireless phone, a mobile phone, a smart phone, an e-book, a PMP (portable multimedia player), a digital camera, a digital audio recorder/player, a digital picture/video recorder/player, a portable game machine, a navigation system, a black box, a three-dimensional television, a device capable of transmitting and receiving information at a wireless circumstance, one of various electronic devices constituting a home network, one of various electronic devices constituting a computer network, one of various electronic devices constituting a telematics network, RFID, an embedded system, or one of various electronic devices constituting a computing system.

In various embodiments, the controller 3200 or the data storage media 3900 may be packed using packages such as PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), and the like.

Figure 12:
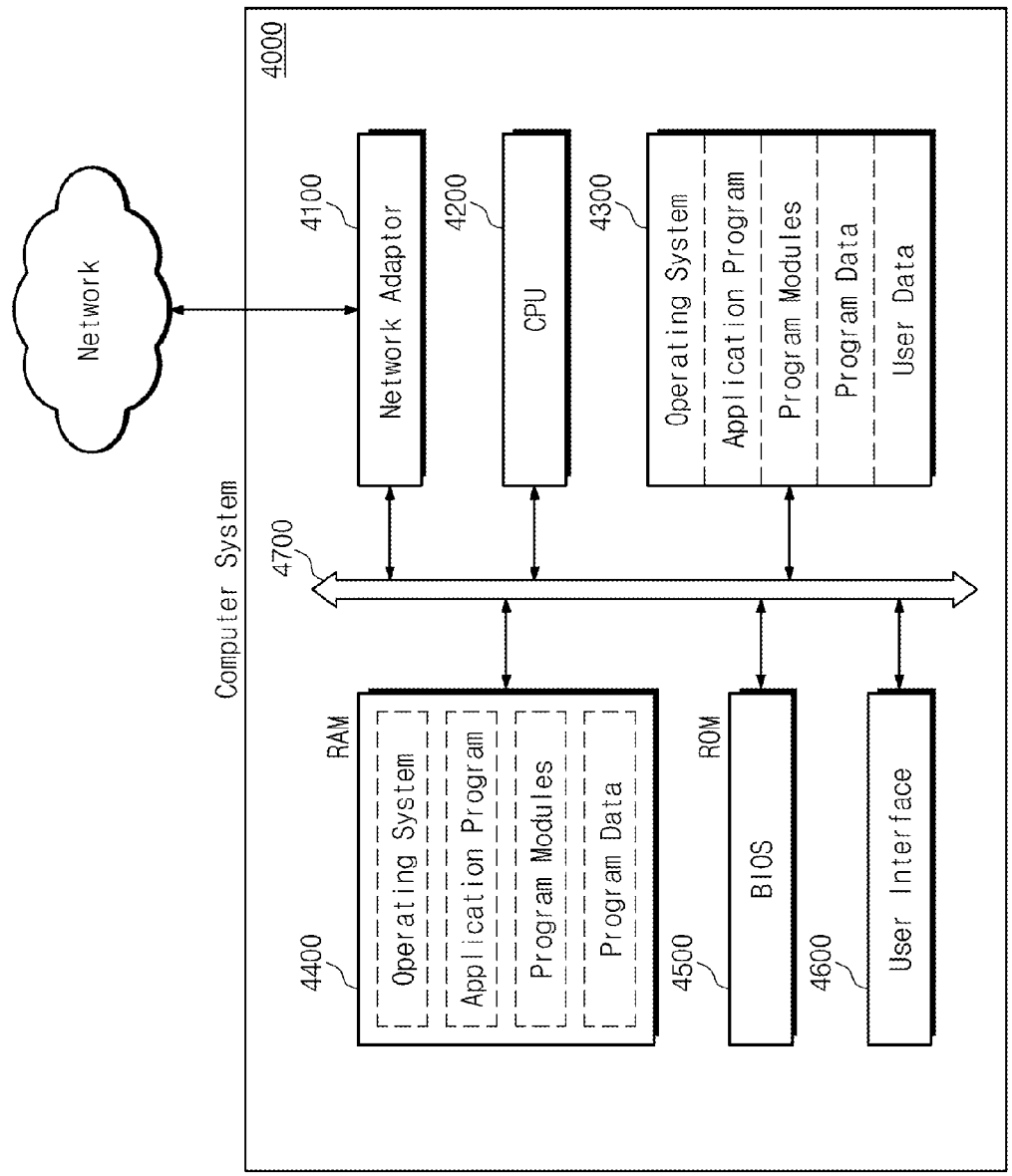
FIG. 12 is a block diagram of a computing system including a user device in FIG. 10, according to an exemplary embodiment.

FIG. 12 is a block diagram of a computing system including a user device in FIG. 10, according to an exemplary embodiment.

A computer system 4000 includes a network adaptor 4100, a CPU 4200, a data storage device 4300, RAM 4400, ROM 4500, and a user interface 4600 which are electrically connected to a system bus 4700. The data storage device 4300 may be formed of a user device in FIG. 10, for example. Alternatively, the data storage device 4300 may be formed of a user device in FIG. 11.

The network adaptor 4100 provides an interface between the computer system 4000 and external networks. The CPU 4200 controls an overall operation for driving an operating system and an application program which are resident on the RAM 4400. The data storage device 4300 stores data needed for the computer system 4000. For example, the data storage device 4300 may store an operating system for driving the computer system 4000, an application program, various program modules, program data, user data, and the like.

The RAM 4400 is used as a working memory of the computer system 4000. Upon booting, the operating system, the application program, the various program modules, and program data needed to drive programs and various program modules read out from the data storage device 4300 is loaded on the RAM 4400. The ROM 4500 stores a basic input/output system (BIOS) which is activated before the operating system is driven upon booting. Information exchange between the computer system 4000 and a user is made via the user interface 4600.

In addition, the computer system 4000 may further include a battery, a modem, and the like. Although not shown in FIG. 12, the computer system 4000 may further include an application chipset, a camera image processor (CIS), a mobile DRAM, and the like.

While the inventive concept has been described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. A method of operating a high voltage generating circuit comprising:

using an adjustable oscillator to generate a first pumping clock signal by delaying a clock signal by a first delay time;

performing a first charge pumping operation using a first high voltage pump circuit in response to the first pumping clock signal;

using a first adjustable delay circuit to generate a second pumping clock signal by delaying the first pumping clock signal by a second delay time;

performing a second charge pumping operation using a second high voltage pump circuit in response to the second pumping clock signal;

generating an output voltage in response to the first and second charge pumping operations;

using a level detector to detect a level of the output voltage; and activating the adjustable oscillator when the level of the output voltage is not greater than a target voltage, else inactivating the adjustable oscillator when the level of the output voltage is greater than the target voltage.

2. The method of claim 1, wherein the adjustable oscillator generates the first pumping clock signal and the first adjustable delay circuit generate the second pumping clock signal in response to a commonly applied control code.

3. The method of claim 2, wherein the first and second delay times are adjusted according to the control code, and a sum of the first and second delay times is not greater than a period of the clock signal.

4. The operating method of claim 3, wherein the first delay time is equal to the second delay time.

5. A high voltage generating circuit for generating an output voltage having a voltage level higher than a power supply voltage, the high voltage generating circuit comprising:

an oscillator comprising an adjustable oscillator and an adjustable delay block, the adjustable oscillator being configured to output a first pumping clock signal and the adjustable delay block being configured to output a second pumping clock signal by delaying the first pumping clock signal by a first delay time;

a high voltage pump comprising first and second high voltage pump circuits, the first high voltage pump circuit being configured to perform a first charge pumping operation in response to the first pumping clock signal and the second high voltage pump circuit being configured to perform a second charge pumping operation in response to the second pumping clock signal, the high voltage pump outputting the output voltage based on the first and second charge pumping operations; and a level detector configured to detect a voltage level of the output voltage, the oscillator being controlled to adjust at least a clock period of the first pumping clock signal when the detected voltage level of the output voltage differs from a target voltage.

6. The high voltage generating circuit of claim 5, wherein the adjustable oscillator is configured to adjust the period of the first pumping clock signal in response to a control code.

7. The high voltage generating circuit of claim 5, wherein the adjustable delay block comprises a first adjustable delay circuit configured to adjust the first pumping clock signal by the first delay time in response to a control code.

8. The high voltage generating circuit of claim 7, wherein the first adjustable delay circuit comprises a buffer that delays the first pumping clock signal by the first delay time.

9. The high voltage generating circuit of claim 7, wherein the first pumping clock signal is increasingly delayed by the first delay time as the period of the first pumping clock signal increases.

10. The high voltage generating circuit of claim 7, wherein the first pumping clock signal is decreasingly delayed by the first delay time as the period of the first pumping clock signal decreases.

11. The high voltage generating circuit of claim 7, wherein the first adjustable delay circuit includes at least one of a resistance and a capacitance that is adjusted in response to the control code, such that the first delay time varies in response to the at least one resistance and capacitance.

12. The high voltage generating circuit of claim 5, wherein the adjustable delay block further comprises a second adjustable delay circuit configured to output a third pumping clock signal by delaying the second pumping clock signal by a second delay, and the high voltage pump further comprises a third high voltage pump circuit being configured to perform a third charge pumping operation in response to the third pumping clock signal.

13. The high voltage generating circuit of claim 12, wherein the output voltage generated in response to the first, second and third charge pumping operations is provided to a memory cell array of a nonvolatile memory device.

14. The high voltage generating circuit of claim 12, wherein a sum of the first and second delay times is less than or equal to the period of the first clock signal.

15. The high voltage generating circuit of claim 12, wherein the first delay time is equal to the second delay time.

16. The high voltage generating circuit of claim 5, wherein the adjustable delay block is further configured to output a third pumping clock signal by delaying the second pumping clock signal by a second delay time; and wherein the high voltage pump further comprises a third high voltage pump circuit configured to perform a third charge pumping operation in response to the third pumping clock signal, the high voltage pump outputting the output voltage based on the first, second and third charge pumping operations.

17. The high voltage generating circuit of claim 16, wherein the adjustable delay block comprises:

a first adjustable delay circuit configured to receive the first pumping clock signal and output the second pumping clock signal based on the first pumping clock signal and a control code; and a second high voltage pump circuit configured to receive the second pumping clock signal and output the third pumping clock signal based on the second pumping clock signal and the control code.

18. The high voltage generating circuit of claim 5, wherein the level detector is configured to provide an oscillator enable signal for activating and inactivating the oscillator.

19. The high voltage generating circuit of claim 5, wherein the first delay time increases when the clock period of the first pumping clock signal becomes longer, and decreases when the clock period of the first pumping clock signal becomes shorter.

* * * * *